(12) United States Patent  
Cheng et al.

(10) Patent No.: US 12,100,743 B2  
(45) Date of Patent: Sep. 24, 2024

(54) SEMICONDUCTOR DEVICE AND METHOD FOR FORMING THE SAME

(71) Applicant: Powerchip Semiconductor Manufacturing Corporation, Hsinchu (TW)

(72) Inventors: Ying-Chi Cheng, Kaohsiung (TW); Yu-Jen Huang, Hsinchu (TW); Shin-Hong Chen, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 434 days.

(21) Appl. No.: 17/546,072

(22) Filed: Dec. 9, 2021

(65) Prior Publication Data

US 2023/0132488 A1    May 4, 2023

(30) Foreign Application Priority Data

Oct. 28, 2021    (TW) ................. 110140156

(51) Int. Cl.
*H01L 29/40* (2006.01)
*H01L 29/423* (2006.01)
(Continued)

(52) U.S. Cl.
CPC .......... *H01L 29/407* (2013.01); *H01L 29/401* (2013.01); *H01L 29/4236* (2013.01); *H01L 29/66666* (2013.01); *H01L 29/7827* (2013.01)

(58) Field of Classification Search
CPC . H01L 29/407; H01L 29/401; H01L 29/4236; H01L 29/66666; H01L 29/7827;
(Continued)

(56) References Cited

U.S. PATENT DOCUMENTS 7,186,618 B2    3/2007 Polzl et al.
8,431,989 B2    4/2013 Bhalla et al.
(Continued)

FOREIGN PATENT DOCUMENTS

CN    107681006    2/2018
TW    201032278    9/2010

OTHER PUBLICATIONS

"Office Action of Taiwan Counterpart Application", issued on Jul. 26, 2022, p. 1-p. 6.

*Primary Examiner* — Shahed Ahmed
*Assistant Examiner* — Khatib A Rahman
(74) *Attorney, Agent, or Firm* — JCIPRNET

(57) ABSTRACT

A semiconductor device and a method for forming the same are provided. The semiconductor device includes a substrate and a gate structure. The gate structure is disposed in the substrate and includes a shielded gate, a control gate, and a plurality of insulating layers. The shielded gate includes a bottom gate and a top gate. The bottom gate includes a step structure consisting of a plurality of electrodes. A width of the electrode is smaller as the electrode is farther away from the top gate, and a width of the top gate is smaller than a width of the electrode closest to the top gate. The control gate is disposed on the shielded gate. A first insulating layer is disposed between the shielded gate and the substrate. A second insulating layer is disposed on the shielded gate. A third insulating layer is disposed between the control gate and the substrate.

4 Claims, 8 Drawing Sheets

(51) Int. Cl.
  *H01L 29/66* (2006.01)
  *H01L 29/78* (2006.01)

(58) Field of Classification Search
  CPC ............... H01L 29/41; H01L 29/42376; H01L 29/66727; H01L 29/66734; H01L 29/7813; H01L 29/41766; H01L 29/66484
  See application file for complete search history.

(56) References Cited

U.S. PATENT DOCUMENTS

| | | | |
|---|---|---|---|
| 8,889,532 B2* | 11/2014 | Burke | H01L 29/66348 |
| | | | 438/270 |
| 9,048,214 B2* | 6/2015 | Padmanabhan | H01L 29/404 |
| 9,559,198 B2 | 1/2017 | Stefanov et al. | |
| 2011/0133258 A1* | 6/2011 | Chen | H01L 29/66734 |
| | | | 257/E21.409 |
| 2012/0187474 A1* | 7/2012 | Rexer | H01L 29/66727 |
| | | | 438/270 |
| 2017/0213908 A1* | 7/2017 | Fursin | H01L 29/407 |
| 2020/0212218 A1* | 7/2020 | Kim | H01L 29/1095 |
| 2020/0243656 A1* | 7/2020 | Shibib | H01L 29/404 |
| 2022/0052170 A1* | 2/2022 | Zeng | H01L 29/0878 |

\* cited by examiner

SEMICONDUCTOR DEVICE AND METHOD FOR FORMING THE SAME

CROSS-REFERENCE TO RELATED APPLICATION

This application claims the priority benefits of Taiwan application serial no. 110140156, filed on Oct. 28, 2021. The entirety of the above-mentioned patent application is hereby incorporated by reference herein and made a part of this specification.

BACKGROUND

Technical Field

The disclosure relates to a semiconductor device and a method for forming the same, particularly to a power semiconductor device and a method for forming the same.

Description of Related Art

The power semiconductor device requires a low gate-to-drain capacitance during operation to ensure sufficient response speed and to avoid excessive switching power loss. Such condition may be satisfied efficiently by using the trench-type metal oxide semi-transistor devices with shielded gates.

As the size of the power semiconductor devices has been progressively micronized, it is one of the current goals to further increase the breakdown voltage and/or reduce the on-resistance of the power semiconductor device while maintaining a low gate-to-drain capacitance.

SUMMARY

The disclosure provides a semiconductor device and a method for forming the same. The semiconductor device has an increased breakdown voltage and a reduced on-resistance while maintaining a low gate-to-drain capacitance.

The semiconductor device of the disclosure includes a substrate and a gate structure. The substrate has a trench. The gate structure is disposed in the trench and includes a shielded gate, a control gate, a first insulating layer, a second insulating layer, and a third insulating layer. The shielded gate includes a bottom gate and a top gate. The bottom gate includes a step structure consisting of a plurality of electrodes, and the width of one of the electrodes is smaller as the electrode is farther away from the top gate. The top gate is disposed on the bottom gate, and the width of the top gate is smaller than the width of the electrode of the electrodes that is closest to the top gate. The control gate is disposed on the shielded gate. The first insulating layer is disposed between the shielded gate and the substrate. The second insulating layer is disposed on the shielded gate to separate the shielded gate from the control gate. The third insulating layer is disposed between the control gate and the substrate.

In an embodiment of the disclosure, the bottom gate includes a first conductive layer and a second conductive layer, wherein the second conductive layer is disposed on the first conductive layer, and the second conductive layer includes the electrodes.

In an embodiment of the disclosure, the second conductive layer includes a first electrode, a second electrode, and a third electrode stacked in sequence, the width of the third electrode is greater than the width of the second electrode, and the width of the second electrode is greater than the width of the first electrode.

In an embodiment of the disclosure, the width of the first electrode is greater than the width of the first conductive layer.

In an embodiment of the disclosure, the semiconductor device further includes a substrate region and a source region. The substrate region is disposed in the substrate and between adjacent trenches, and it has a first conductivity type. The source region is disposed in the substrate region and has a second conductivity type. The first conductivity type is P-type and the second conductivity type is N-type; or the first conductivity type is N-type and the second conductivity type is P-type.

In an embodiment of the disclosure, the height from the top surface of the first conductive layer to the bottom surface of the first conductive layer is 1.5 μm to 2.0 μm.

In an embodiment of the disclosure, the height from the top surface of the first electrode to the bottom surface of the first electrode is 0.7 μm to 1.2 μm, the height from the top surface of the second electrode to the bottom surface of the second electrode is 0.7 μm to 1.2 μm, and the height from the top surface of the third electrode to the bottom surface of the third electrode is 0.3 μm to 0.6 μm.

In an embodiment of the disclosure, the distance between the first electrode and a sidewall of the trench is 4000 Å to 4500 Å, the distance between the second electrode and the sidewall of the trench is 3000 Å to 3500 Å, and the distance between the third electrode and the sidewall of the trench is 2000 Å to 2500 Å.

The method for forming the semiconductor device of the disclosure includes the following steps. First, a substrate including a trench is provided, wherein an insulating material layer is formed on the substrate, and the trench includes a first accommodating space. Next, a shielded gate is formed in the trench, a step including the following steps: step (a): fill the trench with a first conductive material layer; step (b): remove part of the first conductive material layer in the trench to expose part of the first accommodating space; step (c): remove part of the insulating material layer in the trench through isotropic etching; step (d): repeat the cycle of step (b) to step (c) several times to form a first conductive layer and a second accommodating space having a step structure in the trench; step (e): form a second conductive layer in the trench, wherein the second conductive layer is partially filled in the second accommodating space, and the second conductive layer includes the step structure consisting of a plurality of electrodes; step (f): form a sacrificial layer in the second accommodating space of the trench, wherein the sacrificial layer is disposed on a sidewall of the trench to form a third accommodating space; and step (g): form a third conductive layer in the trench, wherein the third conductive layer is partially filled in the third accommodating space. Afterwards, the sacrificial layer and part of the insulating material layer are removed in the trench. Then, a control gate is formed in the trench. The width of one of the electrodes of the second conductive layer is smaller as it is farther away from the third conductive layer, and the width of the third conductive layer is smaller than the width of the electrode closest to the third conductive layer in the second conductive layer.

In an embodiment of the disclosure, in the step of forming the shielded gate in the trench, the cycle of the step (b) to the step (c) is repeated three times.

In an embodiment of the disclosure, after removing the sacrificial layer and part of the insulating material layer in the trench, it further includes forming an inter-gate insulating layer on the shielded gate, wherein the inter-gate insulating layer separates the shielded gate from the control gate.

In an embodiment of the disclosure, after the control gate is formed in the trench, the following steps are further included. First, a substrate region having a first conductivity type is formed in the substrate, wherein the substrate region is located between adjacent trenches. Next, a source region having a second conductivity type is formed in the substrate region. The first conductivity type is P-type and the second conductivity type is N-type; or the first conductivity type is N-type and the second conductivity type is P-type.

Based on the above, in the semiconductor device and the method for forming the same provided by the disclosure, the bottom gate of the shielded gate has a step structure consisting of a plurality of electrodes, such that the semiconductor device of the disclosure has an improved breakdown voltage and a reduced on-resistance. In addition, in the disclosure, the gate-to-drain capacitance may be prevented from increasing by making the width of the top gate of the shielded gate smaller than the width of the electrode of the bottom gate closest to it, thereby maintaining the electrical characteristics of the semiconductor device of the disclosure.

DESCRIPTION OF THE EMBODIMENTS

In the following embodiments, the first conductivity type is P-type, and the second conductivity type is N-type; however, the disclosure is not limited thereto. In other embodiments, the first conductivity type may be P type, and the second conductivity type may be N type. The P-type dopant is, for example, boron, and the N-type dopant is, for example, phosphorus or arsenic.

Unless defined otherwise, all terms (including technical and scientific terms) used herein have the same meaning commonly understood by those of ordinary skill in the art to which the disclosure belongs. It is further understood that terms such as those defined in regular dictionaries should be interpreted as having meanings consistent with their meanings in the context of related technologies and the disclosure, instead of being interpreted as an idealized or overly formal meaning unless it is clearly defined as such in this article.

The schematic diagrams herein are only used to illustrate some embodiments of the disclosure. Therefore, the shape, number, and ratio of each element shown in the schematic diagram should not be used to limit the disclosure.

Figure 1A:
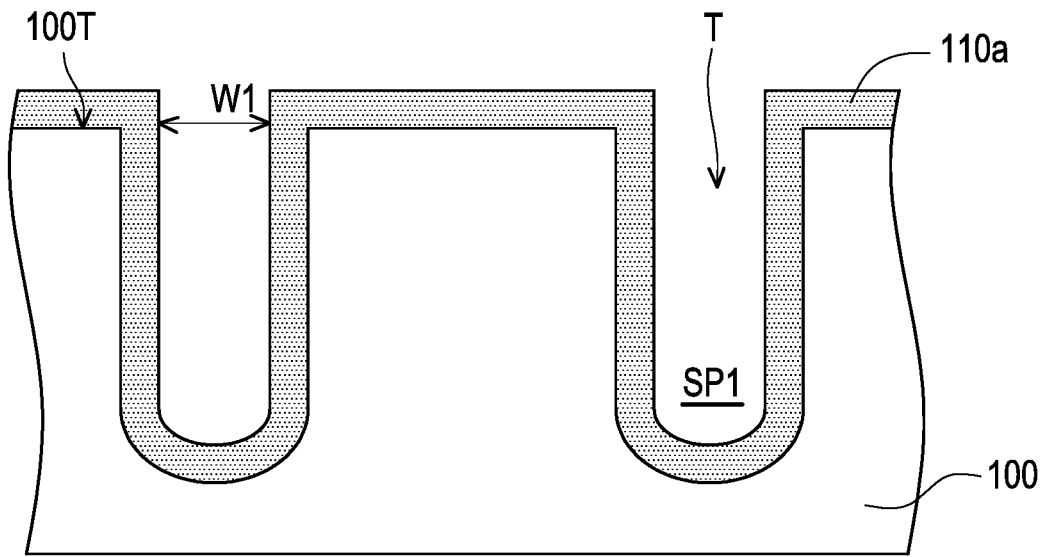
FIG. 1A to FIG. 1O are schematic cross-sectional views of a method for forming a semiconductor device according to an embodiment of the disclosure.

FIG. 1A to FIG. 1O are schematic cross-sectional views of a method for forming a semiconductor device according to an embodiment of the disclosure.

First, in FIG. 1A, a substrate 100 is provided. In this embodiment, the substrate 100 is an epitaxial layer, but the disclosure is not limited thereto. The substrate 100 may be formed by, for example, a selective epitaxy growth (SEG) in a silicon substrate (not shown), and the disclosure is not limited thereto. In some embodiments, the doping concentration of the epitaxial layer may be less than the doping concentration of the silicon substrate.

After that, a plurality of trenches T are formed in the substrate 100. In some embodiments, the ways to form the trenches T includes, for example, the following steps, but the disclosure is not limited thereto. First, a mask layer (not shown) is formed on the substrate 100; then, a patterning process is performed using the mask layer as a mask to remove part of the substrate 100; then, the mask layer is removed.

Next, an insulating material layer 110a is conformally formed on the substrate 100. Specifically, the insulating material layer 110a may be formed in the trench T and extend from the surface of the trench T and cover the top surface 100T of the substrate 100, for example. In some embodiments, the formation of the insulating material layer 110a includes performing thermal oxidation or chemical vapor deposition, wherein the material of the insulating material layer 110a includes silicon oxide. After the insulating material layer 110a is conformally formed on the substrate 100, the trench T has a first accommodating space SP1. The first accommodating space SP1 here refers to an accommodating space that has not been formed or occupied by any conductive material layer in the trench T, and has, for example, a substantially fixed first width W1.

Figure 1B:
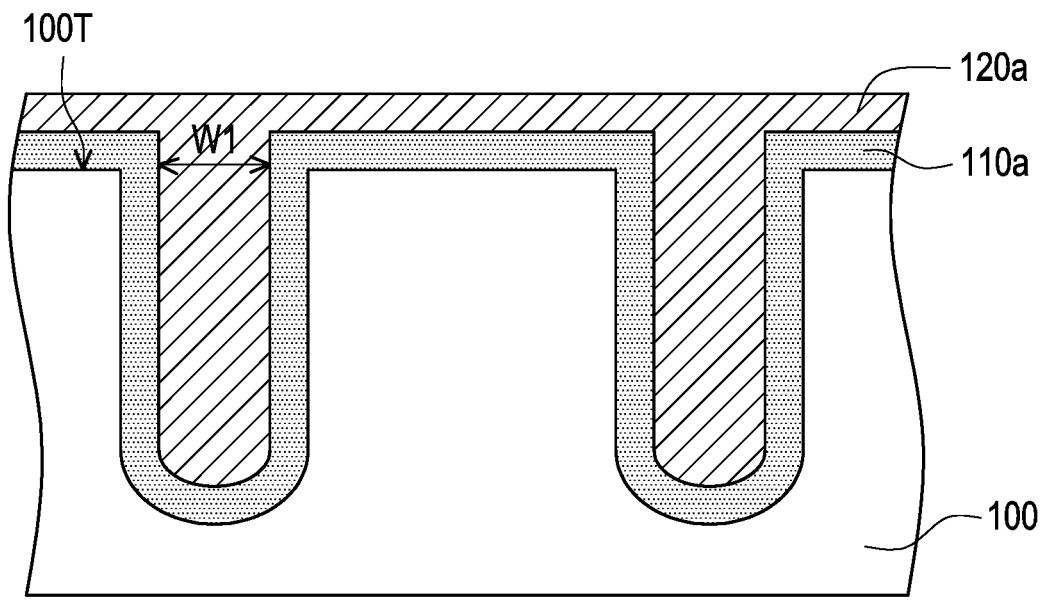

In this embodiment, a step of forming a shielded gate in the trench T is performed below. In FIG. 1B, the trench T is filled with a conductive material layer 120a. In this embodiment, in addition to being formed in the trench T, the conductive material layer 120a may also cover the top surface 100T of the substrate 100 as shown in FIG. 1B, but the disclosure is not limited thereto. In some embodiments, the formation of the conductive material layer 120a includes performing chemical vapor deposition, wherein the material of the conductive material layer 120a includes doped polysilicon.

Figure 1C:
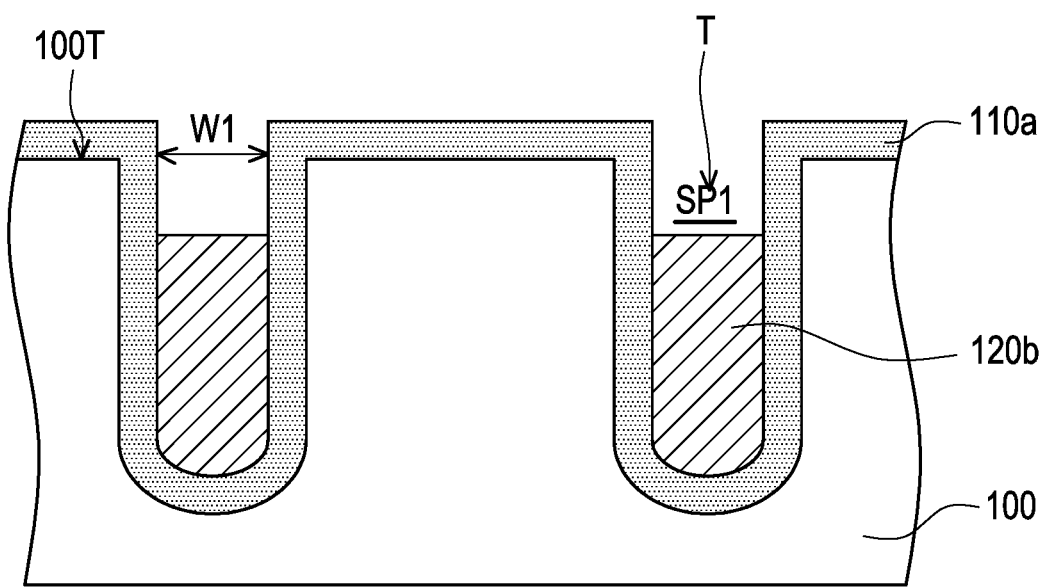

In FIG. 1C, part of the conductive material layer 120a is removed in the trench T. To remove part of the conductive material layer 120a in the trench T, the following steps may be performed for example, but the disclosure is not limited thereto. First, a planarization process is performed on the conductive material layer 120a (if the conductive material layer 120a is formed on the top surface 100T of the substrate 100; in contrast, if the conductive material layer 120a is not formed on the top surface 100T of the substrate 100 in other embodiments, this step may be omitted), so that the top surface of the conductive material layer 120a is substantially flush with the top surface 100T of the substrate 100. Then, an etching process is performed to remove part of the conductive material layer 120a in the trench T to form the conductive material layer 120b and expose part of the first accommodating space SP1. The etching process includes wet etching and dry etching, to which the disclosure is not limited. In this embodiment, the first width W1 of the first accommodating space SP1 is substantially the same as the width of the conductive material layer 120b, but the disclosure is not limited thereto. In some embodiments, the trench T may have an arc-shaped bottom surface, and therefore the conductive material layer 120b may also have an arc-shaped bottom surface.

Figure 1D:
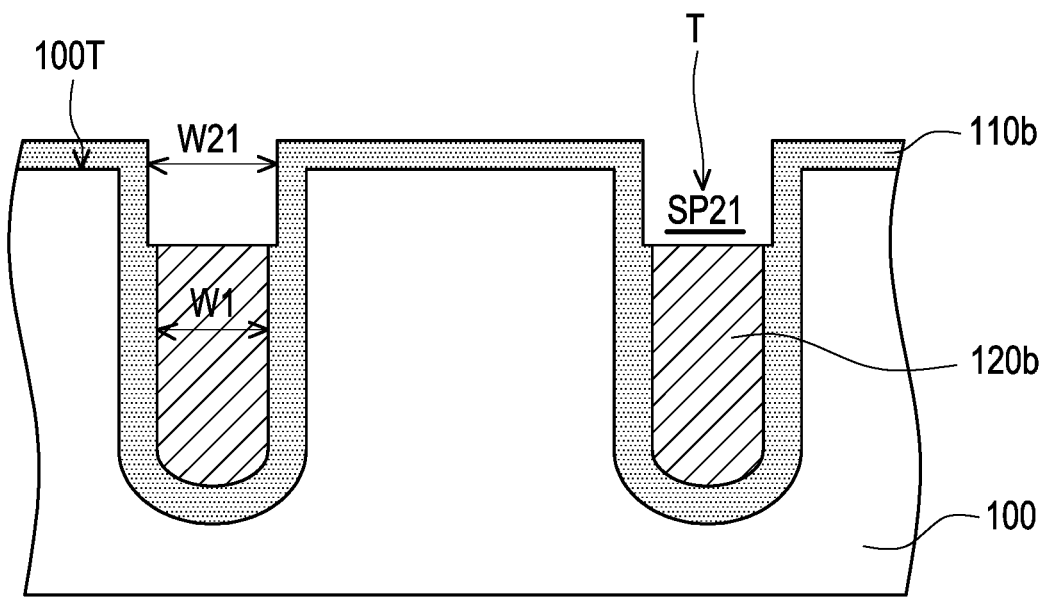

In FIG. 1D, part of the insulating material layer 110a is removed in the trench T using an isotropic etching process. That is, part of the insulating material layer 110a on the top surface 100T of the substrate 100 and part of the insulating material layer 110a on the sidewalls of the trench T are removed. The isotropic etching process includes, for example, wet etching, to which the disclosure is not limited. After removing part of the insulating material layer 110a in the trench T, the insulating material layer 110b and the second accommodating space SP21 are formed. The second accommodating space SP21 here refers to the accommodating space in the trench T where the conductive material layer 120*b* is not formed after part of the insulating material layer 110*a* is removed, which has a second width W21. By removing part of the insulating material layer 110*a* using an isotropic etching process, the second width W21 of the second accommodating space SP21 is greater than the first width W1 of the first accommodating space SP1. In addition, note that although the present embodiment adopts isotropic etching to remove part of the insulating material layer 110*a*, the disclosure is not limited thereto. In other words, any removal process may be adopted as long as it is capable of removing at least part of the insulating material layer 110*a* on the sidewall of the trench T.

Figure 1E:
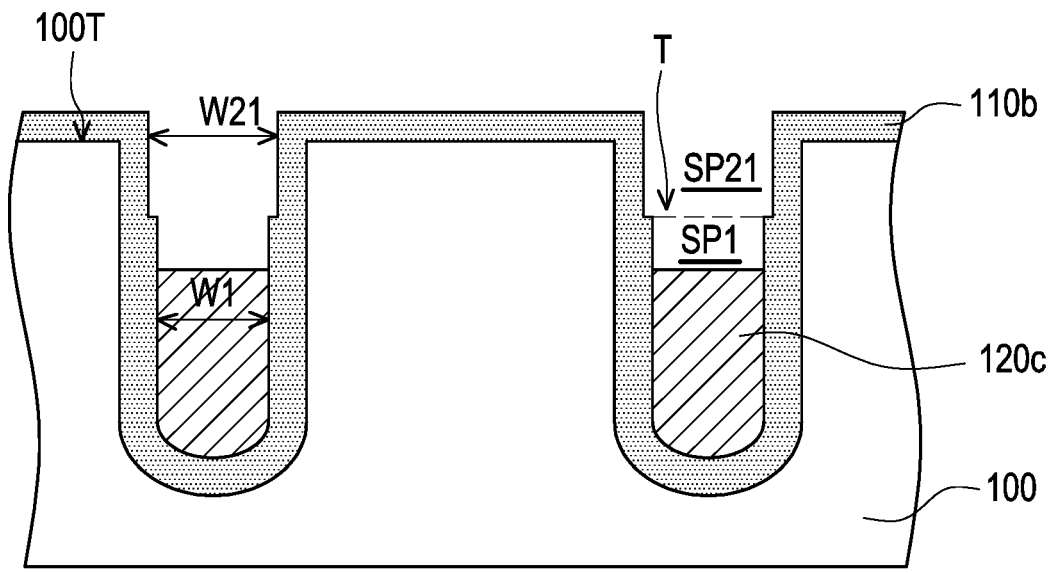

In FIG. 1E, part of the conductive material layer 120*b* is removed in the trench T. To remove part of the conductive material layer 120*b* in the trench T, for example, the insulating material layer 110*b* may be adapted as a mask to perform etching to remove part of the conductive material layer 120*b* in the trench T, but the disclosure is not limited thereto. The etching process includes wet etching and dry etching, to which the disclosure is not limited. After removing part of the conductive material layer 120*b* in the trench T, the conductive material layer 120*c* is formed and part of the first accommodating space SP1 is exposed.

Figure 1F:
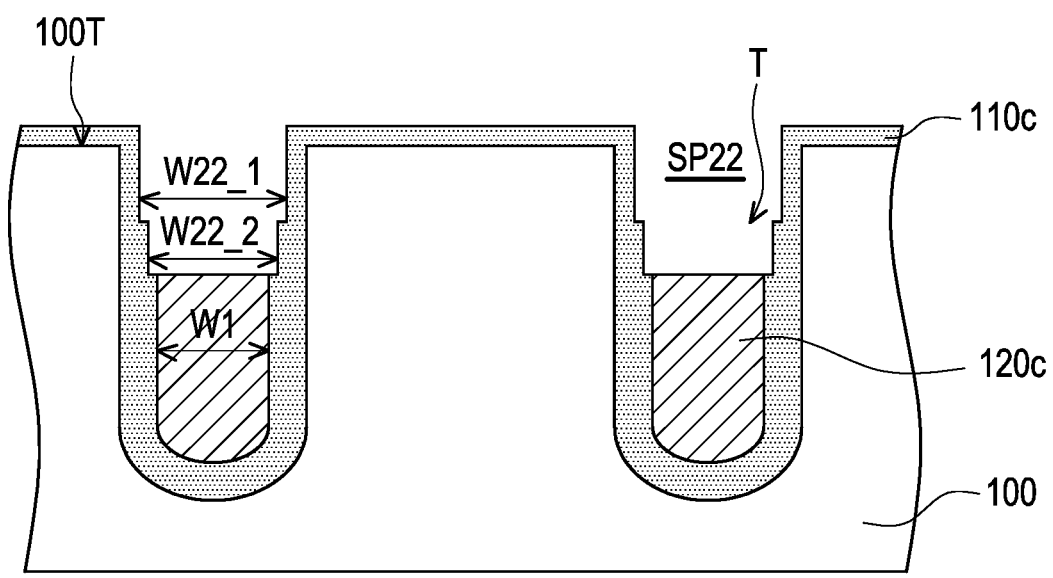

In FIG. 1F, part of the insulating material layer 110*b* is removed in the trench T using an isotropic etching process. That is, part of the insulating material layer 110*b* on the top surface 100T of the substrate 100 and part of the insulating material layer 110*b* on the sidewall of the trench T are removed. The isotropic etching process includes, for example, wet etching, to which the disclosure is not limited. After removing part of the insulating material layer 110*b* in the trench T, the insulating material layer 110*c* and the second accommodating space SP22 are formed. The second accommodating space SP22 here refers to the accommodating space in the trench T where the conductive material layer 120*c* is not formed after a portion of the insulating material layer 110*b* is removed. The second accommodating space SP22 has a step shape that has one step. The platform section has a second width W22_1 and the first step section has a second width W22_2, and the second width W22_1 is greater than the second width W22_2. In addition, due to the isotropic etching process that removes part of the insulating material layer 110*b*, the second width W22_1 and the second width W22_2 are both greater than the first width W1. From another point of view, the trench T has, for example, a ring-shaped step shape at this time, but the disclosure is not limited thereto. In addition, note here that although the present embodiment adopts isotropic etching to remove part of the insulating material layer 110*b*, the disclosure is not limited thereto. In other words, any removal process may be adopted as long as it is capable of removing at least part of the insulating material layer 110*b* on the sidewall of the trench T.

Figure 1G:
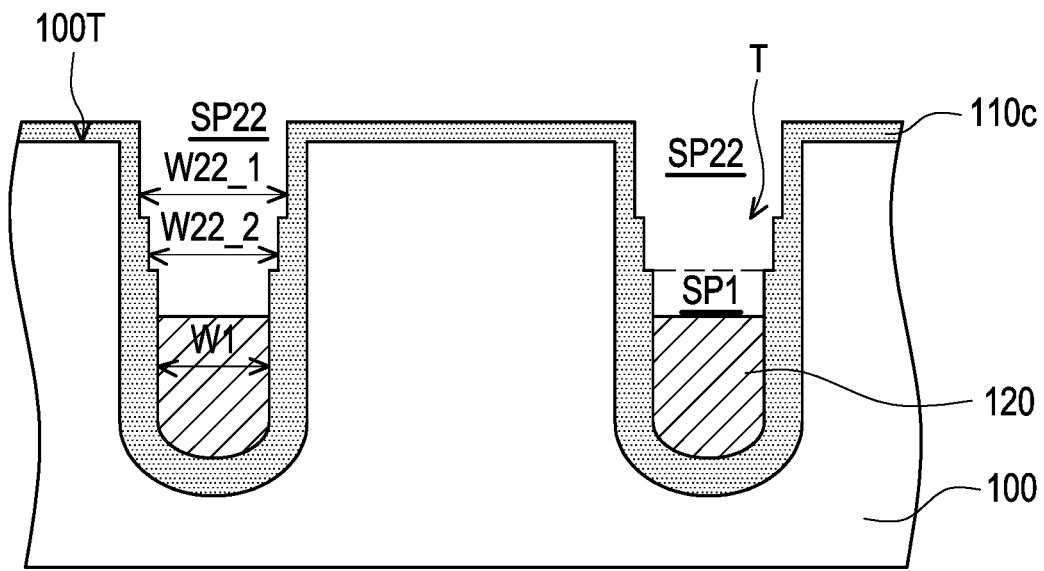

In FIG. 1G, part of the conductive material layer 120*c* is removed in the trench T. To remove part of the conductive material layer 120*c* in the trench T, for example, the insulating material layer 110*c* may be adapted as a mask to perform an etching process to remove part of the conductive material layer 120*c* in the trench T, but the disclosure is not limited thereto. The etching process includes wet etching and dry etching, to which the disclosure is not limited. After removing part of the conductive material layer 120*c* in the trench T, the first conductive layer 120 is formed and part of the first accommodating space SP1 is exposed. In this embodiment, the first conductive layer 120 also has a first width W1.

Figure 1H:
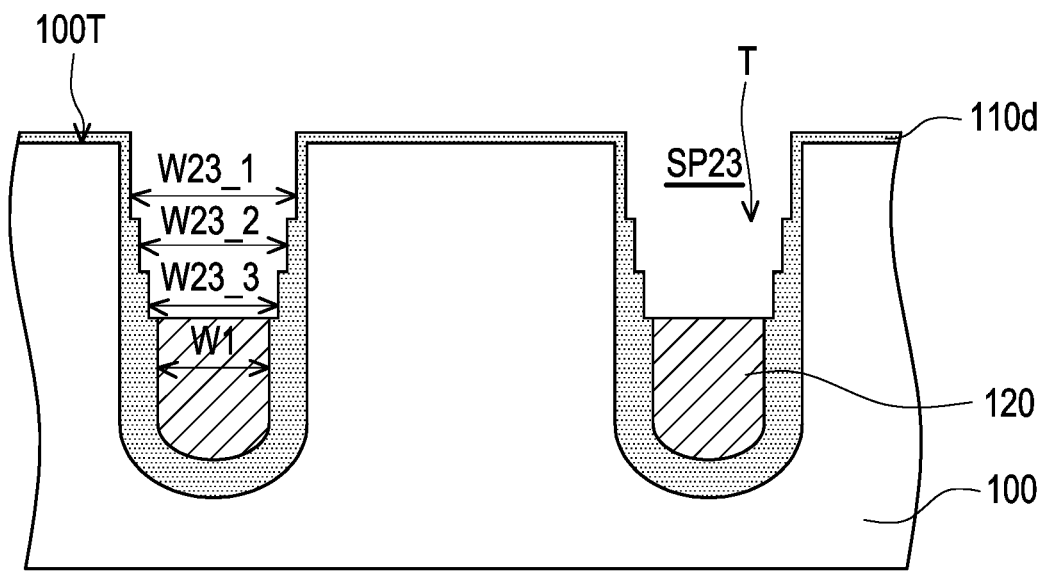

In FIG. 1H, part of the insulating material layer 110*c* is removed in the trench T using an isotropic etching process. That is, part of the insulating material layer 110*c* on the top surface 100T of the substrate 100 and part of the insulating material layer 110*c* on the sidewall of the trench T are removed. The isotropic etching process includes, for example, wet etching, to which the disclosure is not limited. After removing part of the insulating material layer 110*c* in the trench T, the insulating material layer 110*d* and the second accommodating space SP23 are formed. The second accommodating space SP23 here refers to the accommodating space in the trench T where the first conductive layer 120 is not formed after part of the insulating material layer 110*c* is removed on the sidewall of the trench T. The second accommodating space SP23 has a step shape that has two steps. The platform section has a second width W23_1, the first step section has a second width W23_2, and the second step section has a third width W23_3. The second width W23_1 is greater than the second width W23_2, and the second width W23_2 is greater than the second width W23_3. In addition, due to the isotropic etching process that removes part of the insulating material layer 110*c*, the second width W23_1, the second width W23_2, and the second width W23_3 are all greater than the first width W1. From another point of view, the trench T has, for example, a ring-shaped step shape at this time, but the disclosure is not limited thereto. In addition, note here that although the present embodiment adopts an isotropic etching process to remove part of the insulating material layer 110*c*, the disclosure is not limited thereto. In other words, any removal process may be adopted as long as it is capable of removing at least part of the insulating material layer 110*a* on the sidewall of the trench T.

Note here that in the process steps shown in FIG. 1C to In FIG. 1H, the cycle of the following steps are repeated three times: removing part of the conductive material layer in the trench T; and removing part of the insulating material layer using an isotropic etching process. However, the disclosure does not limit the number of times the cycles are performed. In other words, in other embodiments, the above steps may be repeated twice (which is the minimum number of times to form a stepped second accommodating space) or more than four cycles.

Figure 1I:
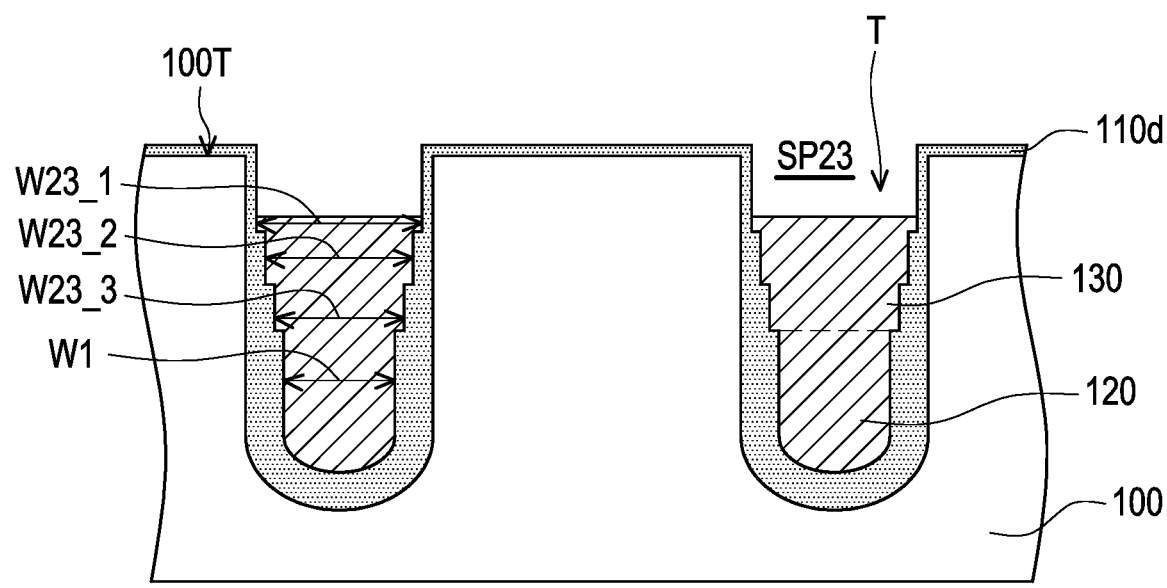

In FIG. 1I, a second conductive layer 130 is formed in the trench T. For example, the second conductive layer 130 is partially filled in the second accommodating space SP23. To form the second conductive layer 130 in the trench T, the following steps may be performed for example, but the disclosure is not limited thereto. First, a second conductive material layer (not shown) filled in the trench T is formed. A planarization process is performed on the second conductive material layer (if a second conductive material layer is formed on the top surface 100T of the substrate 100; in contrast, if the second conductive material layer is not formed on the top surface 100T of the substrate 100, this step may be omitted), so that the top surface of the second conductive material layer and the top surface 100T of the substrate 100 are substantially flush. Then, an etching process is performed to remove part of the second conductive material layer in the trench T to form the second conductive layer 130 and expose part of the second accommodating space SP23. The etching process includes wet etching and dry etching, to which the disclosure is not limited. In this embodiment, the shape of the second conductive layer 130 is similar to the shape of the second accommodating space SP23, and it also has a step structure that has two steps. The platform section of the second conductive layer 130 has a second width W23_1. The first step section of the second conductive layer 130 has a second width W23_2, and the second step section of the second conductive layer 130 has a third width W23_3. The second width W23_1 is greater than the second width W23_2, and the second width W23_2 is greater than the second width W23_3. The material of the second conductive layer 130 is, for example, the same as the material of the first conductive layer 120. In other words, the material of the second conductive layer 130 includes, for example, doped polysilicon.

Figure 1J:
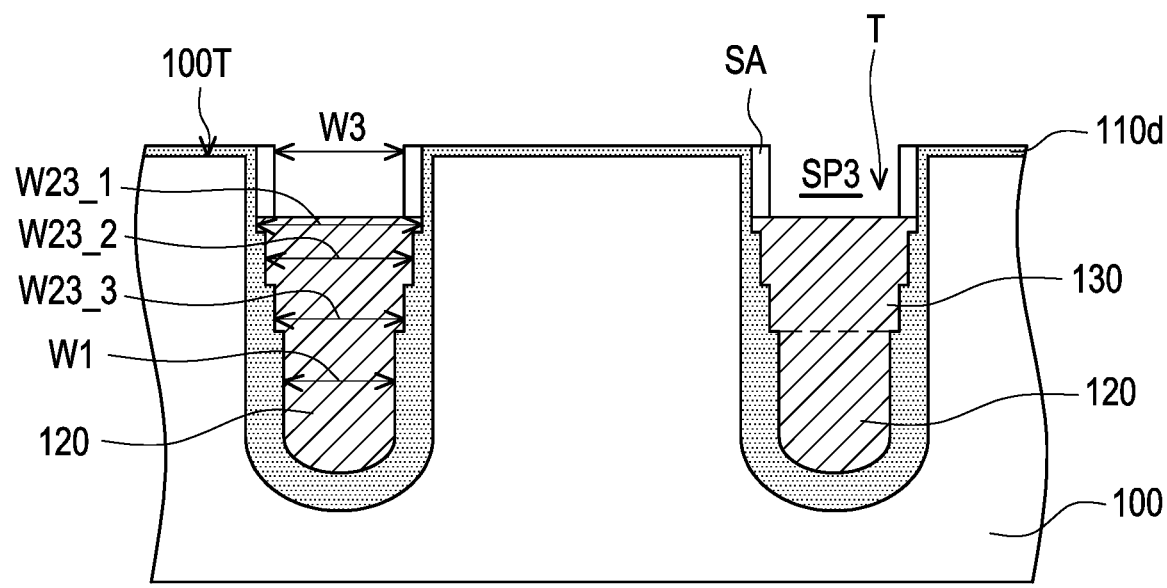

In FIG. 1J, a sacrificial layer SA is formed in the second accommodating space SP23 of the trench T. The following steps may be performed to form the sacrificial layer SA in the second accommodating space SP23 of the trench T, but the disclosure is not limited thereto. First, a sacrificial material layer (not shown) is conformally formed on the substrate 100. Specifically, the sacrificial material layer may, for example, be formed in the trench T and extend from the surface of the trench T and cover the top surface 100T of the substrate 100. In some embodiments, the formation of the sacrificial material layer includes performing thermal oxidation or chemical vapor deposition. After the sacrificial material layer is conformally formed on the substrate 100, an etching process is performed to remove the sacrificial material layer on the top surface 100T of the substrate 100 and the bottom of the second accommodating space SP23 of the trench T to form the sacrificial layer SA on the sidewall of the trench T. The sacrificial layer SA is disposed on the insulating material layer 110d. In this embodiment, the sacrificial layer SA on the sidewall of the trench T defines a third accommodating space SP3 having a third width W3. Since there are more sacrificial layers SA than the second accommodating space SP23, the third width W3 of the third accommodating space SP3 is smaller than the second width W23_1 of the second accommodating space SP23.

Figure 1K:
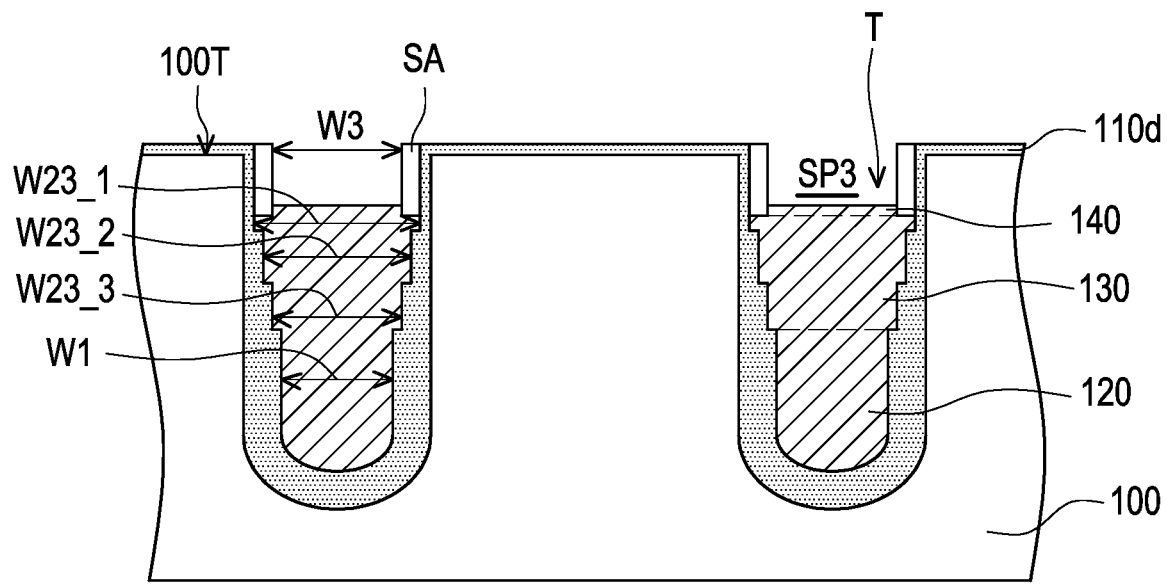

In FIG. 1K, a third conductive layer 140 is formed in the trench T. The third conductive layer 140 is partially filled in the third accommodating space SP3, for example. The formation of the third conductive layer 140 in the trench T includes, for example, the following steps, but the disclosure is not limited thereto. First, a third conductive material layer (not shown) filled in the trench T is formed. A planarization process is performed on the third conductive material layer (if a third conductive material layer is formed on the top surface 100T of the substrate 100; in contrast, if the third conductive material layer is not formed on the top surface 100T of the substrate 100, this step may be omitted), so that the top surface of the third conductive material layer is substantially flush with the top surface 100T of the substrate 100. Then, an etching process is performed to remove part of the third conductive material layer in the trench T to form the third conductive layer 140 and expose part of the third accommodating space SP3. The etching process includes wet etching and dry etching, to which the disclosure is not limited. In this embodiment, the third width W3 of the third accommodating space SP3 is substantially the same as the width of the third conductive layer 140, but the disclosure is not limited thereto. In addition, in this embodiment, the width of the third conductive layer 140 is smaller than the width of the electrode closest to the third conductive layer 140 in the second conductive layer 130. Specifically, the third width W3 of the third conductive layer 140 is smaller than the second width W23_1 of the platform section of the second conductive layer 130. The material of the third conductive layer 140 is, for example, the same as the material of the first conductive layer 120 and the material of the second conductive layer 130. In other words, the material of the third conductive layer 140 may also include, for example, doped polysilicon.

So far, the fabrication of the shielded gate SG of this embodiment is completed. In other words, the shielded gate SG may be composed of, for example, the first conductive layer 120, the second conductive layer 130, and the third conductive layer 140. However, although the formation of the shielded gate SG of this embodiment is described by taking the above-mentioned method as an example, it is not limited thereto.

Figure 1L:
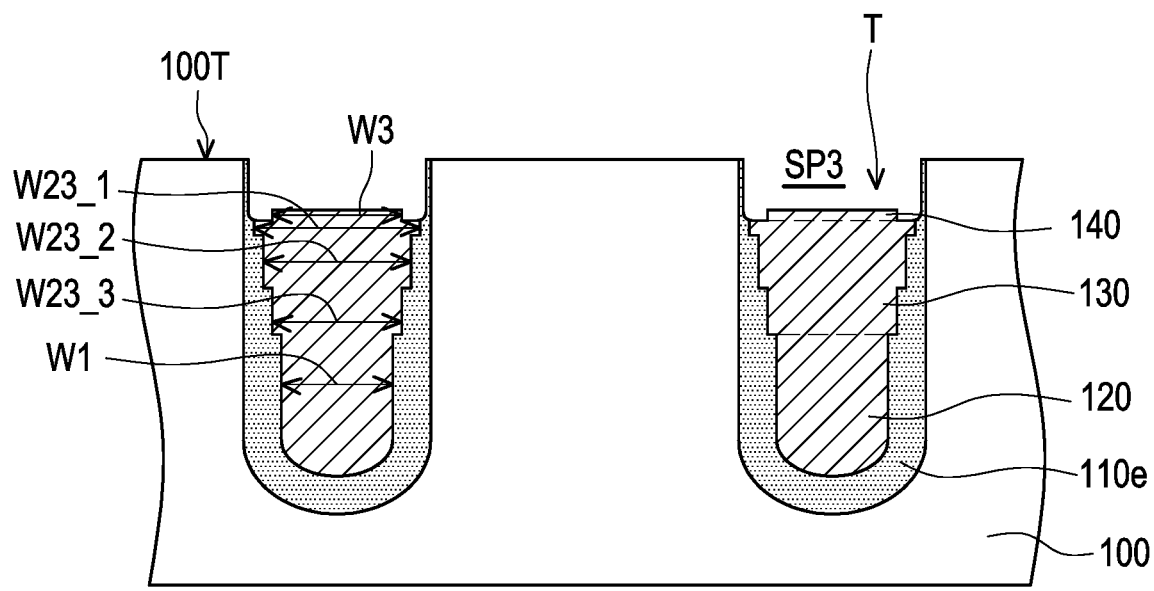

In FIG. 1L, the sacrificial layer SA and part of the insulating material layer 110d are removed in the trench T. The sacrificial layer SA and part of the insulating material layer 110d in the trench T may be removed by, for example, performing an isotropic etching process which includes wet etching and dry etching, to which the disclosure is not limited. After removing the sacrificial layer SA and part of the insulating material layer 110d in the trench T, an insulating material layer 110e is formed.

Figure 1M:
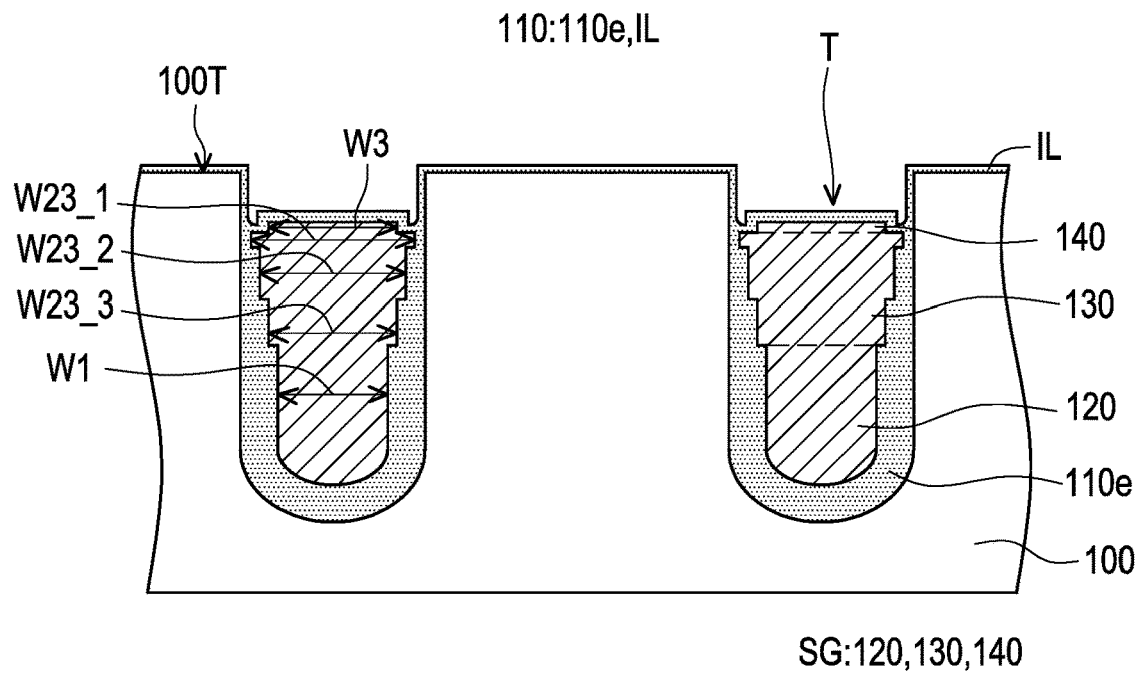

In FIG. 1M, an insulating layer IL is formed on the shielded gate SG. In some embodiments, the formation of the insulating layer IL includes performing thermal oxidation or chemical vapor deposition, where the material of the insulating layer IL includes silicon oxide. In addition to being formed on the shielded gate SG in the trench T, the insulating layer IL of this embodiment may also, for example, conformally extend from the top surface of the shielded gate SG to the top surface 100T of the substrate 100 and cover the top surface 100T of the substrate 100.

Figure 1N:
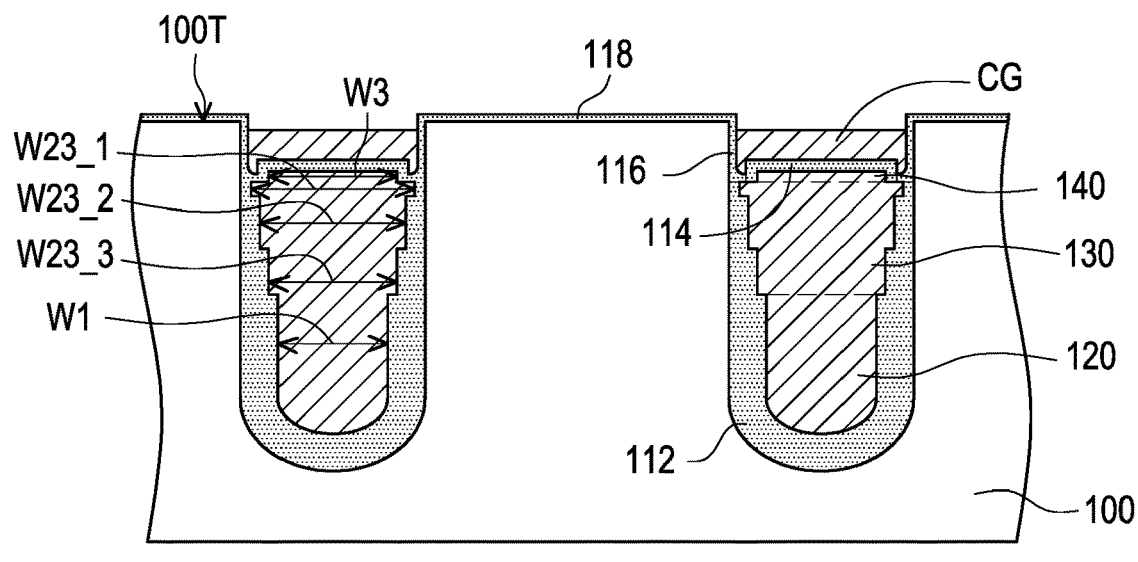
Figure 10:
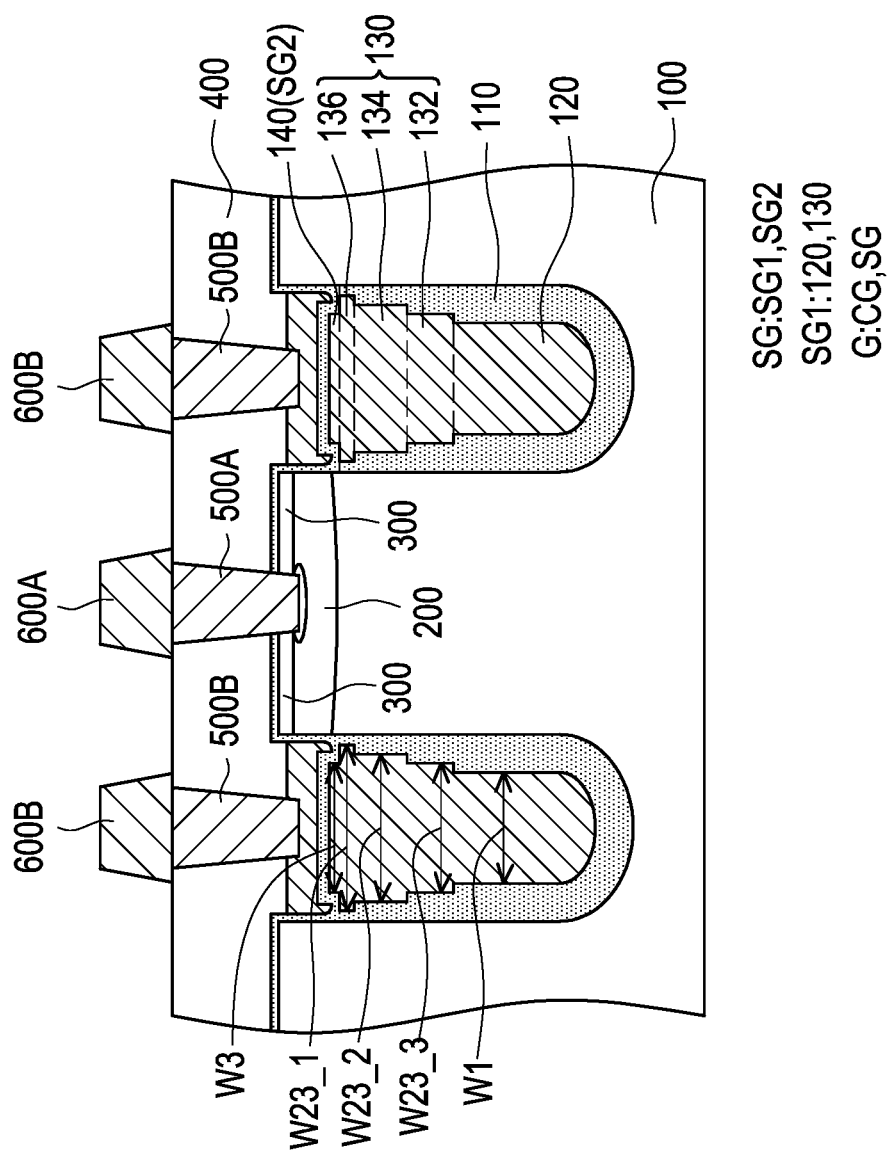

In FIG. 1N, a control gate CG is formed in the trench T. To form the control gate CG in the trench T, the following steps may be performed for example, but the disclosure is not limited thereto. First, a control gate material layer (not shown) filled in the trench T is formed. A planarization process is perform on the control gate material layer (if the control gate material layer is formed on the top surface 100T of the substrate 100; in contrast, if the control gate material layer is not formed on the top surface 100T of the substrate 100, this step may be omitted), so that the top surface of the control gate material layer and the top surface 100T of the substrate 100 are substantially flush. Then, an etching process is performed to remove part of the control gate material layer in the trench T to form the control gate CG. The etching process includes wet etching and dry etching, to which the disclosure is not limited. The material of the control gate CG is, for example, the same as the material of the shielded gate SG. In other words, the material of the control gate CG also includes, for example, doped polysilicon. In this embodiment, the control gate CG and the shielded gate SG form the gate part of the gate structure G. In addition, the insulating layer IL and the insulating material layer 110e form the insulating layer 110 together. The insulating layer 110 includes: a first insulating layer 112 between the shielded gate SG and the substrate 100; a second insulating layer 114 between the control gate CG and the shielded gate SG; a third insulating layer 116 between the control gate CG and the substrate 100; and a fourth insulating layer 118 on the top surface 100T of the substrate 100. The first insulating layer 112, the second insulating layer 114, and the third insulating layer 116, for example, constitute the insulating layer of the gate structure G.

In FIG. 1O, a substrate region 200 having a first conductivity type and a source region 300 having a second conductivity type are sequentially formed in the substrate 100. The substrate region 200 may be formed, for example, by performing an ion implantation and then a heat treatment, where the dopant implanted in the ion implantation process is, for example, boron, and the disclosure is not limited thereto. In addition, the source region 300 may also be formed by, for example, performing an ion implantation and then a heat treatment. The dopant implanted in the ion implantation process is, for example, phosphorus or arsenic, which is not limited in the disclosure. In some embodiments, the substrate region 200 is disposed between adjacent trenches T, and the source region 300 is disposed in the substrate region 200.

Please proceed to see FIG. 1O. After the substrate region 200 having the first conductivity type and the source region 300 having the second conductivity type are sequentially formed in the substrate 100, an insulating layer 400 is formed on the substrate 100. The insulating layer 400 covers the top surface of the insulating layer 110 and fills the trench T, for example. In some embodiments, the formation of the insulating layer 400 includes performing thermal oxidation or chemical vapor deposition, wherein the material of the insulating layer 400 includes silicon oxide. In this embodiment, the insulating layer 400 is adopted as an interlayer dielectric layer, but the disclosure is not limited thereto.

In FIG. 1O, after the insulating layer 400 is formed on the substrate 100, a contact window 500A and a contact window 500B penetrating through the insulating layer 400 and the insulating layer 110 are formed. The contact window 500A and the contact window 500B are respectively electrically connected to the source region 300 and the control gate CG. In some embodiments, the formation of the contact window 500A and the contact window 500B includes performing the following steps. First, a mask layer (not shown) is formed on the top surface of the insulating layer 400; afterwards, a patterning process is performed using the mask layer as a mask to remove part of the insulating layer 400 and the insulating layer 110 to form a plurality of openings, wherein the openings expose part of the source region 300 and part of the control gate CG; next, the mask layer is removed; then, a conductor layer is filled in the openings to respectively form a contact window 500A electrically connected to the source region 300 and a contact window 500B electrically connected to the control gate CG. In some embodiments, the formation of the conductor layer includes performing chemical vapor deposition, wherein the material includes a metal, which may be tungsten.

Please proceed to see FIG. 1O. After forming the contact window 500A and the contact window 500B on the substrate 100, an interconnection layer 600A and an interconnection layer 600B are formed. The interconnection layer 600A and the interconnection layer 600B are electrically connected to the contact window 500A and the contact window 500B, respectively. In some embodiments, the formation of the interconnection layer 600A and the interconnection layer 600B includes the following steps. First, an interconnect material layer (not shown) is formed on the insulating layer 400; afterwards, a mask layer (not shown) is formed on the top surface of the insulating layer 400; then, a patterning process is performed using the mask layer as a mask to remove part of the interconnect material layer to form the interconnect layer 600A and the interconnect layer 600B. In some embodiments, the formation of the interconnection layer 600A and the interconnection layer 600B includes chemical vapor deposition or physical vapor deposition, and the material includes metal, which may be copper, aluminum, aluminum copper, or other suitable metals.

The fabrication of the semiconductor device 10 of the disclosure is completed to this point.

Although the method for forming the semiconductor device 10 of this embodiment is described by taking the above method as an example, the method for forming the semiconductor device 10 of the disclosure is not limited thereto.

Please proceed to see FIG. 1O. FIG. 1O illustrates a schematic cross-sectional view of a semiconductor device 10 according to an embodiment of the disclosure. It must be noted here that please refer to the description and effects of the foregoing embodiments for the following description of the omitted parts, as the same description is not repeated in the following embodiments.

In some embodiments, the semiconductor device 10 includes a substrate 100, a gate structure G, a substrate region 200, and a source region 300.

The substrate 100 is, for example, an epitaxial layer having a second conductivity type. For example, the substrate 100 may be an N-type epitaxial layer, but the disclosure is not limited thereto. The substrate 100 has, for example, a plurality of trenches T, and the gate structure G described later is disposed in the trenches T.

The gate structure G is disposed, for example, in the trench T, and includes a shielded gate SG, a control gate CG, a first insulating layer 112, a second insulating layer 114, and a third insulating layer 116. The shielded gate SG includes, for example, a bottom gate SG1 and a top gate SG2 provided on the bottom gate SG1. The bottom gate SG1 is composed of, for example, a first conductive layer 120 and a second conductive layer 130. The top gate SG2 is composed of, for example, a third conductive layer 140. In this embodiment, the bottom gate SG1 includes a step structure consisting of a plurality of electrodes, and the width of one of the electrodes is smaller as it is farther away from the upper electrode SG2. Specifically, the bottom gate SG1 includes a step structure composed of the first conductive layer 120 and the second conductive layer 130.

The first conductive layer 120 has, for example, an approximately rectangular shape and a first width W1. In some embodiments, the height from the top surface of the first conductive layer 120 to the bottom surface of the first conductive layer 120 is 1.5 μm to 2.0 μm. The first conductive layer 120 may, for example, have an arc-shaped bottom surface, and the disclosure is not limited thereto.

The second conductive layer 130 has, for example, a step structure. The second conductive layer 130 in this embodiment has a step that has two steps, and includes a first electrode 132, a second electrode 134, and a third electrode 136 stacked in sequence, but the disclosure is not limited thereto. In some embodiments, the height from the top surface of the first electrode 132 to the bottom surface of the first electrode 132 is 0.7 μm to 1.2 μm, the height from the top surface of the second electrode 134 to the bottom surface of the second electrode 134 is 0.7 μm to 1.2 μm, and the height from the top surface of the third electrode 136 to the bottom surface of the third electrode 136 is 0.3 μm to 0.6 μm. In addition, in some embodiments, the distance between the first electrode 132 and the sidewall of the trench T is 4000 Å to 4500 Å, the distance between the second electrode 134 and the sidewall of the trench T is 3000 Å to 3500 Å, and the distance between the third electrode 136 and the sidewall of the trench T is 2000 Å to 2500 Å.

The third conductive layer 140 also has, for example, an approximately rectangular shape and a third width W3. In some embodiments, the height from the top surface of the third conductive layer 140 to the bottom surface of the third conductive layer 140 is 0.1 μm to 0.3 μm. In addition, in some embodiments, the distance between the third conductive layer 140 and the sidewall of the trench T is 3000 Å to 3500 Å.

From another perspective, in this embodiment, the third electrode 136 (the platform section of the second conductive layer 130) has a second width W23_1, the second electrode 134 (the first step section of the second conductive layer 130) has a second width W23_2, and the first electrode 132 (the second step section of the second conductive layer 130) has a second width W23_3. The second width W23_1 is greater than the second width W23_2, the second width W23_2 is greater than the second width W23_3, and the second width W23_3 is greater than the first width W1. In this embodiment, the width of the top gate SG2 is smaller than the width of the electrode of the bottom gate SG1 closest to the top gate SG2. Specifically, the electrode closest to the top gate SG2 is the third electrode 136 in the second conductive layer 130 as shown in FIG. 1O, and the third width W3 of the top gate SG2 is smaller than the second width W23_1 of the third electrode 136. The control gate CG is, for example, disposed on the shielded gate SG and separated by the second insulating layer 114. In some embodiments, the control gate CG and the shielded gate SG includes similar materials, which may be doped polysilicon.

The first insulating layer 112 is, for example, disposed between the shielded gate SG and the substrate 100. The second insulating layer 114 is, for example, disposed on the shielded gate SG and serves as an inter-gate insulating layer to separate the shielded gate SG from the control gate CG. The third insulating layer 116 is, for example, disposed between the control gate CG and the substrate 100. In some embodiments, the first insulating layer 112, the second insulating layer 114, and the third insulating layer 116 include similar materials, which may be silicon oxide.

The substrate region 200 is, for example, disposed in the substrate 100 and located between adjacent trenches T. In some embodiments, the substrate region 200 has the first conductivity type. For example, the substrate region 200 may be a P-type well region and include boron. The source region 300 is disposed, for example, in the substrate region 200. In some embodiments, the source region 300 has the second conductivity type. For example, the source region 300 may be an N-type well region and include phosphorus or arsenic.

In some embodiments, the semiconductor device 10 may further include a contact window 500A, a contact window 500B, an interconnect layer 600A, and an interconnect layer 600B. Please refer to the foregoing embodiments for the materials, functions, and formation of the contact window 500A, the contact window 500B, the interconnection layer 600A, and the interconnection layer 600B, as the same is not repeated here.

In this embodiment, the electric field distribution of the semiconductor device 10 of this embodiment may be improved by providing the second conductive layer 130 of the shielded gate SG a step structure and the above parameter design, thereby improving the breakdown voltage of the semiconductor device 10. In addition, since the second conductive layer 130 has a step structure, the first insulating layer 112 between the sidewall of the trench T and the shielded gate SG is thinner than the corresponding insulating layer in the semiconductor device of the prior art. Therefore, the pitch between the semiconductor devices 10 of this embodiment may be shortened to reduce the on-resistance of the semiconductor device 10. Furthermore, by making the third width W3 of the third conductive layer 140 smaller than the width of the electrode of the bottom gate SG1 closest to the top gate SG2 (the second width W23_1 of the third electrode 136), the semiconductor device 10 of the present embodiment may avoid generating excessive gate-to-drain capacitance due to the step structure design of the second conductive layer 130, and avoid increasing the switching power loss of the semiconductor device 10.

In summary, the disclosure provides a semiconductor device including a shielded gate design in which the shielded gate includes a bottom gate and a top gate. The bottom gate includes a step structure consisting of a plurality of electrodes. The width of the top gate is smaller than the width of the electrode of the bottom gate closest to it. Based on this, the semiconductor device of the disclosure has an improved breakdown voltage and a reduced on-resistance, and may prevent the gate-to-drain capacitance from increasing, thereby maintaining the electrical characteristics of the semiconductor device of the disclosure and improving the clamping capability.

What is claimed is:

1. A method for forming a semiconductor device, comprising:
   providing a substrate having a trench, wherein an insulating material layer is formed on the substrate, and the trench comprises a first accommodating space;
   forming a shielded gate in the trench comprising:
      step (a): filling the trench with a first conductive material layer;
      step (b): removing part of the first conductive material layer in the trench to expose part of the first accommodating space;
      step (c): removing part of the insulating material layer in the trench through isotropic etching;
      step (d): repeating a cycle of the step (b) to the step (c) several times to form a first conductive layer and a second accommodating space having a step structure in the trench;
      step (e): forming a second conductive layer in the trench, wherein the second conductive layer is partially filled in the second accommodating space, and the second conductive layer comprises the step structure consisting of a plurality of electrodes;
      step (f): forming a sacrificial layer in the second accommodating space of the trench, wherein the sacrificial layer is disposed on a sidewall of the trench to form a third accommodating space; and
      step (g): forming a third conductive layer in the trench, wherein the third conductive layer is partially filled in the third accommodating space;
   removing the sacrificial layer and part of the insulating material layer in the trench; and
   forming a control gate in the trench,
   wherein a width of one of the electrodes of the second conductive layer is smaller as the one of the electrodes is farther away from the third conductive layer, and a width of the third conductive layer is smaller than a width of an electrode of the electrodes closest to the third conductive layer in the second conductive layer.

2. The method for forming the semiconductor device according to claim 1, wherein when forming the shielded gate in the trench, the cycle of the step (b) to the step (c) is repeated three times.

3. The method for forming the semiconductor device according to claim 1, after removing the sacrificial layer and part of the insulating material layer in the trench, further comprising forming an inter-gate insulating layer on the shielded gate, wherein the inter-gate insulating layer separates the shielded gate from the control gate.

4. The method for forming the semiconductor device according to claim 1, after the control gate is formed in the trench, further comprising:
- forming a substrate region having a first conductivity type in the substrate, wherein the substrate region is located between adjacent trenches; and
- forming a source region having a second conductivity type in the substrate region,
- wherein the first conductivity type is P type and the second conductivity type is N type, or the first conductivity type is N type and the second conductivity type is P type.

* * * * *